United States Patent
Cai et al.

(10) Patent No.: US 10,204,928 B2
(45) Date of Patent: Feb. 12, 2019

(54) DISPLAY SUBSTRATE, LIQUID CRYSTAL DISPLAY PANEL AND DISPLAY APPARATUS HAVING THE SAME, AND FABRICATING METHOD THEREOF

(71) Applicants: BOE TECHNOLOGY GROUP CO., LTD., Beijing (CN); HEFEI XINSHENG OPTOELECTRONICS TECHNOLOGY CO., LTD., Hefei (CN)

(72) Inventors: Zhenfei Cai, Beijing (CN); Qiangqiang Ji, Beijing (CN); Guoquan Liu, Beijing (CN); Zhengwei Chen, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 35 days.

(21) Appl. No.: 15/501,853

(22) PCT Filed: May 20, 2016

(86) PCT No.: PCT/CN2016/082883
§ 371 (c)(1),
(2) Date: Feb. 5, 2017

(87) PCT Pub. No.: WO2017/016290
PCT Pub. Date: Feb. 2, 2017

(65) Prior Publication Data
US 2017/0236837 A1 Aug. 17, 2017

(30) Foreign Application Priority Data
Jul. 27, 2015 (CN) .......................... 2015 1 0455126

(51) Int. Cl.
*G02F 1/136* (2006.01)
*H01L 27/12* (2006.01)
(Continued)

(52) U.S. Cl.
CPC .......... *H01L 27/124* (2013.01); *G02F 1/1368* (2013.01); *G02F 1/13439* (2013.01);
(Continued)

(58) Field of Classification Search
None
See application file for complete search history.

(56) References Cited

U.S. PATENT DOCUMENTS

2004/0257509 A1* 12/2004 Lee ..................... G02F 1/13458
349/139
2011/0024758 A1* 2/2011 Kimura ............. G02F 1/134363
257/59
(Continued)

FOREIGN PATENT DOCUMENTS

CN        1514290 A     7/2004
CN      101075051 A    11/2007
(Continued)

OTHER PUBLICATIONS

First Office Action in the Chinese Patent Application No. 201510455126.2, dated Aug. 11, 2017; English translation attached.
(Continued)

*Primary Examiner* — James A Dudek
(74) *Attorney, Agent, or Firm* — Intellectual Valley Law, P.C.

(57) ABSTRACT

The present application discloses a display substrate comprising a base substrate; a first electrode on the base substrate; a first insulating layer on a side of the first electrode distal to the base substrate; a thin film transistor on a side of the first insulating layer distal to the first electrode; a second insulating layer on a side of the thin film transistor distal to the first insulating layer; an organic layer on a side of the
(Continued)

second insulating layer distal to the thin film transistor; and a second electrode on a side of the organic layer distal to the second insulating layer.

20 Claims, 5 Drawing Sheets

(51) Int. Cl.
*G02F 1/1333* (2006.01)
*G02F 1/1343* (2006.01)
*G02F 1/1362* (2006.01)
*G02F 1/1368* (2006.01)

(52) U.S. Cl.
CPC .. *G02F 1/133345* (2013.01); *G02F 1/134309* (2013.01); *G02F 1/136227* (2013.01); *G02F 1/136286* (2013.01); *H01L 27/1248* (2013.01); *H01L 27/1259* (2013.01); *G02F 2001/136295* (2013.01); *G02F 2201/121* (2013.01); *G02F 2201/123* (2013.01)

(56) References Cited

U.S. PATENT DOCUMENTS

| | | | |
|---|---|---|---|
| 2016/0049424 A1 | 2/2016 | Zhang et al. |
| 2016/0293628 A1 | 10/2016 | Ning |

FOREIGN PATENT DOCUMENTS

| | | |
|---|---|---|
| CN | 101174071 A | 5/2008 |
| CN | 102981336 A | 3/2013 |
| CN | 104217994 A | 12/2014 |
| WO | 2015039389 A1 | 3/2015 |

OTHER PUBLICATIONS

Second Office Action in the Chinese Patent Application No. 201510455126.2, dated Jan. 2, 2018; English translation attached.
International Search Report & Written Opinion dated Jul. 26, 2016 regarding PCT/CN2016/082883.

* cited by examiner

DISPLAY SUBSTRATE, LIQUID CRYSTAL DISPLAY PANEL AND DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/082883, filed May 20, 2016, which claims priority to Chinese Patent Application No. 201510455126.2, filed Jul. 27, 2015, the contents of which are incorporated by reference in the entirety.

TECHNICAL FIELD

The present invention relates to display technology, more particularly, to a display substrate, a liquid crystal display panel and a display apparatus having the same, and a fabricating method thereof.

BACKGROUND

Liquid crystal display apparatuses have the advantages of low power consumption, high display quality, no electromagnetic radiation. They have found a wide range of applications in display field.

SUMMARY

In one aspect, the present disclosure provides a display substrate comprising a base substrate; a first electrode on the base substrate; a first insulating layer on a side of the first electrode distal to the base substrate; a thin film transistor on a side of the first insulating layer distal to the first electrode; a second insulating layer on a side of the thin film transistor distal to the first insulating layer; an organic layer on a side of the second insulating layer distal to the thin film transistor; and a second electrode on a side of the organic layer distal to the second insulating layer.

Optionally, the first electrode is a pixel electrode, and the second electrode is a common electrode; the display substrate further comprising a common electrode line between the organic layer and the common electrode.

Optionally, the first electrode is a pixel electrode, and the second electrode is a common electrode; the display substrate further comprising a common electrode line on a side of the common electrode distal to the organic layer.

Optionally, the first electrode is a common electrode, and the second electrode is a pixel electrode; the display substrate further comprising a common electrode line between the common electrode and the base substrate.

Optionally, the first electrode is a common electrode, and the second electrode is a pixel electrode; the display substrate further comprising a common electrode line between the common electrode and the first insulating layer.

Optionally, the first electrode is a common electrode, and the second electrode is a pixel electrode; the thin film transistor comprises a gate electrode on a side of the first insulating layer distal to the common electrode, a gate insulating layer on a side of the gate electrode distal to the first insulating layer, an active layer on a side of the gate insulating layer distal to the gate electrode, and a source electrode and a drain electrode on a side of the active layer distal to the gate insulating layer; the display substrate further comprising a first via extending through the second insulating layer and the organic layer; the pixel electrode electrically connected to the drain electrode through the first via.

Optionally, the display substrate further comprises a data line, a first terminal electrically connected to the data line, a second via extending through the second insulating layer and the organic layer, the second via exposing part of the first terminal.

Optionally, the display substrate further comprises a gate line, a second terminal electrically connected to the gate line, a third via extending through the organic layer, the second insulating layer and the gate insulating layer, the third via exposing part of the second terminal.

Optionally, the display substrate further comprises a common electrode line, a third terminal electrically connected to the common electrode, a fourth via extending through the organic layer, the second insulating layer, the gate insulating layer and the first insulating layer, the fourth via exposing part of the third terminal.

In another aspect, the present invention provides a method of fabricating a display substrate comprising forming a first electrode on the base substrate; forming a first insulating layer on a side of the first electrode distal to the base substrate; forming a thin film transistor on a side of the first insulating layer distal to the first electrode; forming a second insulating layer on a side of the thin film transistor distal to the first insulating layer; forming an organic layer on a side of the second insulating layer distal to the thin film transistor; and forming a second electrode on a side of the organic layer distal to the second insulating layer.

Optionally, the first electrode is a pixel electrode, and the second electrode is a common electrode; the method further comprising forming a common electrode line subsequent to forming the organic layer and prior to forming the common electrode; the common electrode line is formed between the organic layer and the common electrode.

Optionally, the first electrode is a pixel electrode, and the second electrode is a common electrode; the method further comprising forming a common electrode line subsequent to forming the common electrode; the common electrode line is formed on a side of the common electrode distal to the organic layer.

Optionally, the first electrode is a common electrode, and the second electrode is a pixel electrode; the display substrate further comprising forming a common electrode line prior to forming the common electrode; the common electrode line is formed between the common electrode and the base substrate.

Optionally, the first electrode is a common electrode, and the second electrode is a pixel electrode; the display substrate further comprising forming a common electrode line subsequent to forming the common electrode and prior to forming the first insulating layer; a common electrode line is formed between the common electrode and the first insulating layer.

Optionally, the first electrode is a common electrode, and the second electrode is a pixel electrode; the step of forming the thin film transistor comprises forming a gate electrode on a side of the first insulating layer distal to the common electrode, forming a gate insulating layer on a side of the gate electrode distal to the first insulating layer, forming an active layer on a side of the gate insulating layer distal to the gate electrode, and forming a source electrode and a drain electrode on a side of the active layer distal to the gate insulating layer; the method further comprising forming a first via extending through the second insulating layer and the organic layer; the pixel electrode electrically connected to the drain electrode through the first via.

Optionally, the method further comprises forming a data line, forming a first terminal electrically connected to the data line, and forming a second via extending through the second insulating layer and the organic layer; the second via exposing part of the first terminal.

Optionally, the method further comprises forming a gate line, forming a second terminal electrically connected to the gate lien, and forming a third via extending through the organic layer, the second insulating layer and the gate insulating layer; the third via exposing part of the second terminal.

Optionally, the method further comprises forming a common electrode line, forming a third terminal electrically connected to the common electrode, and forming a fourth via extending through the organic layer, the second insulating layer, the gate insulating layer and the first insulating layer, the fourth via exposing part of the third terminal.

In another aspect, the present invention provides a liquid crystal display panel comprising the display substrate described herein, a package substrate opposite to the display substrate, and a liquid crystal layer between the display substrate and the package substrate In another aspect, the present invention provides a display apparatus comprising the liquid crystal display panel described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

Figure 1:
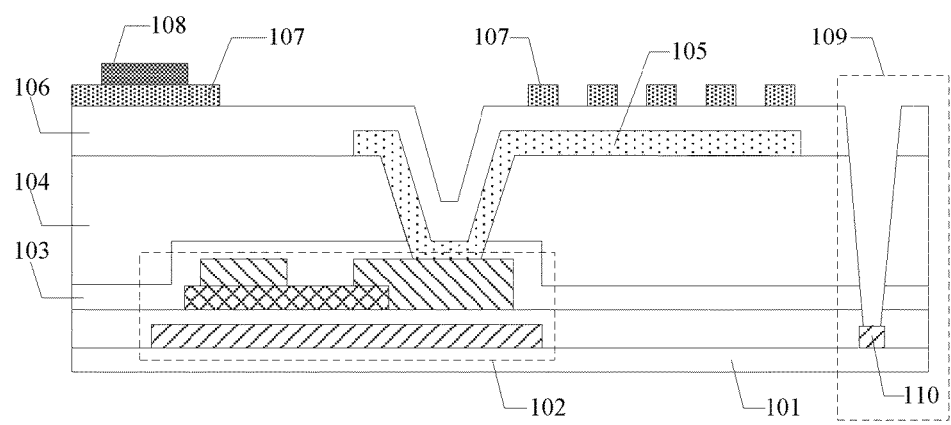
FIG. 1 is a diagram illustrating the structure of a convention display substrate.

FIG. 1 is a diagram illustrating the structure of a conventional display substrate. Referring to FIG. 1, the conventional display substrate includes a base substrate 101, a thin film transistor 102 on the base substrate 101, a first insulating layer 103 on a side of the thin film transistor 102 distal to the base substrate 101, an organic layer 104 on a side of the first insulating layer 103 distal to the thin film transistor 102, a pixel electrode 105 on a side of the organic layer 104 distal to the first insulating layer 103, a second insulating layer 106 on a side of the pixel electrode 105 distal to the organic layer 104, a common electrode 107 on a side of the second insulating layer 106 distal to the pixel electrode 105, and a common electrode line 108 on a side of the common electrode 107 distal to the second insulating layer 106.

Typically, the conventional display substrate is fabricated in the following process: forming a thin film transistor on the base substrate, forming a first insulating material layer on a side of the thin film transistor distal to the base substrate, forming an organic material layer on a side of the first insulating layer distal to the thin film transistor, exposing and developing the organic material layer, etching the first insulating material layer to expose the drain electrode in the thin film transistor, a first terminal electrically connected to a data line in a non-display region, and a second terminal electrically connected to a gate line in the non-display region, thereby forming a first insulating layer and an organic layer. Subsequently, the process further includes forming a pixel electrode on a side of the organic layer distal to the first insulating layer, the pixel electrode electrically connected to the drain electrode through a via extending through the first insulating layer and the organic layer, in addition, the process further includes depositing a second insulating material layer on a side of the pixel electrode distal to the organic layer, patterning the second insulating material layer (e.g., by dry etching) to expose the first terminal and the second terminal, thereby forming the second insulating layer. Moreover, the process further includes forming a common electrode on a side of the second insulating layer distal to the pixel electrode, and forming a common electrode line on a side of the common electrode distal to the second insulating layer.

Prior to depositing the second insulating material layer, the organic layer is formed on the substrate. Typically, the deposition temperature for depositing the second insulating material layer can reach as high as 240 degree Celsius. Similarly, the temperature during dry etching of the second insulating material layer can reach as high as 120 degree Celsius. In these temperature ranges, the organic layer is susceptible to decomposition, releasing gas and other decomposed matter and contaminating deposition device and dry etching equipment.

The present disclosure provides a superior display substrate, a liquid crystal display panel and a display apparatus having the same, and a fabricating method thereof. In the present display substrate and method, the first insulating layer 3 and the second insulating layer 5, as well as the first electrode 2 and the thin film transistor 4, are formed prior to forming the organic layer 6. Only the second electrode 7 is formed subsequent to forming the organic layer 6. The formation of the second electrode 7 is performed by low temperature deposition in combination with wet etching. Thus, the fabrication of the present display substrate obviates the needs for high temperature deposition of any insulating layer or dry etching as required in the conventional display substrate. The issue associated with contamination caused by the decomposition of the organic layer is entirely avoided. Moreover, the present display substrate and method thereof obviate the need for patterning (e.g., a photoresist process and dry etching) the first insulating layer, which is required in the conventional display substrate and method in order to expose lead wire terminals underneath the first insulating layer. The present design greatly simplifies the fabrication process and lowers the manufacture costs.

Figure 2:
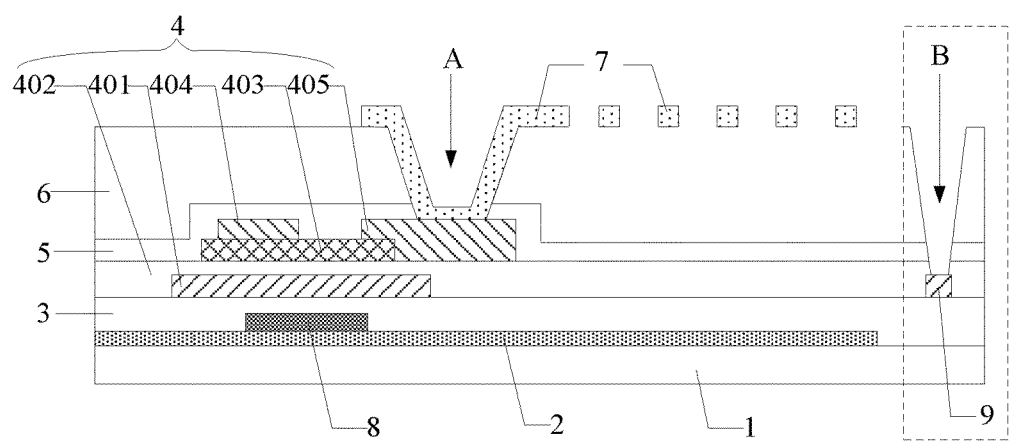
FIG. 2 is a diagram illustrating the structure of a display substrate in some embodiments.

FIG. 2 is a diagram illustrating the structure of a display substrate in some embodiments. Referring to FIG. 2, the display substrate in the embodiment includes a base substrate 1; a first electrode 2 on the base substrate 1; a first insulating layer 3 on a side of the first electrode 2 distal to the base substrate 1; a thin film transistor 4 on a side of the first insulating layer 3 distal to the first electrode 2; a second insulating layer 5 on a side of the thin film transistor 4 distal to the first insulating layer 3; an organic layer 6 on a side of the second insulating layer 5 distal to the thin film transistor 4; and a second electrode 7 on a side of the organic layer 6 distal to the second insulating layer 5.

Accordingly, the present disclosure provides a display substrate having a first electrode 2 and a second electrode 7 on two opposite sides of a thin film transistor 4, the first electrode 2 and the second electrode 7 being two different electrodes selected from a common electrode and a pixel electrode; and a common electrode line 8 on a same side of the thin film transistor 4, and electrically connected to, the common electrode. In some embodiments, the display substrate includes a first electrode 2, a first insulating layer 3, a thin film transistor 4, a second insulating layer 5, an organic layer 6, and a second electrode 7 sequentially on a base substrate 1 along a direction away from the base substrate 1, the first electrode 2 and the second electrode 7 being two different electrodes selected from a common electrode and a pixel electrode.

In some embodiments, the first electrode 2 is a pixel electrode, and the second electrode 7 is a common electrode. Optionally, the display substrate further includes a common electrode line. Optionally, the common electrode line is between the organic layer and the common electrode. Optionally, the common electrode line is on a side of the common electrode distal to the organic layer. Optionally, the display substrate further includes a via extending through the first insulating layer, the pixel electrode connected to the drain electrode of the thin film transistor through the via.

In some embodiments, the first electrode 2 is a common electrode, and the second electrode 7 is a pixel electrode. Referring to FIG. 2, the display substrate in the embodiment further includes a common electrode line 8. Optionally, the common electrode line 8 is between the common electrode and the base substrate 1. Optionally, the common electrode line 8 is between the common electrode and the first insulating layer 3 (as shown in FIG. 2). Optionally, the display substrate further includes a via extending through the second insulating layer 5 and the organic layer 6, the pixel electrode connected to the drain electrode of the thin film transistor through the via. In this design, the cumulative capacitance between the pixel electrode and the data lines as well as power consumption of the display substrate are smaller as compared to those of a display substrate having a pixel electrode as the first electrode and a common electrode as the second electrode.

Typically, a common electrode is made of a transparent conductive material such as indium tin oxide while a common electrode line is made of non-transparent conductive material. The thin film transistor is disposed in an area corresponding to a black matrix in the package substrate to prevent light leakage. Typically, the common electrode line is also disposed a same area to achieve a higher aperture ratio. Optionally, the common electrode is disposed in a same layer as the gate electrode to simplify fabrication process.

Optionally, the thin film transistor is a top-gate thin film transistor. Optionally, the thin film transistor is a bottom-gate thin film transistor.

Referring to FIG. 2, the thin film transistor in the embodiment is a bottom-gate thin film transistor. The thin film transistor in the embodiment includes a gate electrode 401 on a side of the first insulating layer 3 distal to the common electrode 2, a gate insulating layer 402 on a side of the gate electrode 401 distal to the first insulating layer 3, an active layer 403 on a side of the gate insulating layer 402 distal to the gate electrode 401, and a source electrode 404 and a drain electrode 405 on a side of the active layer 403 distal to the gate insulating layer 402. The pixel electrode 7 is connected to the drain electrode 405 through a first via A (FIG. 2). The first via A extends through the second insulating layer 5 and the organic layer 6.

In some embodiments, the data line is electrically connected to a first lead wire through a first terminal. Optionally, the data line, the first lead wire, and the first terminal are in a same layer as the source electrode and the drain electrode. Optionally, the display substrate further includes a second via extending through the second insulating layer and the organic layer, the second via exposing part of a first terminal electrically connected to a data line. A printed circuit board (PCB) may be connected to the first terminal through the second via.

In some embodiments, the gate line is electrically connected to a second lead wire through a second terminal. Optionally, the gate line, the second lead wire, and the second terminal are in a same layer as the gate electrode. Referring to FIG. 2, the display substrate optionally further includes a third via B extending through the organic layer 6, the second insulating layer 5 and the gate insulating layer 402, the third via B exposing part of a second terminal 9 electrically connected to a gate line. Optionally, the third via B is disposed in a non-display area (i.e., a peripheral area; see, e.g., the dotted line area in FIG. 2). A printed circuit board may be connected to the second terminal 9 through the third via B.

In some embodiments, the common electrode line is electrically connected to a third lead wire through a third terminal. Optionally, the common electrode line, the third lead wire, and the third terminal are in a same layer. Optionally, the display substrate further includes a fourth via extending through the organic layer, the second insulating layer, the gate insulating layer and the first insulating layer. The fourth via exposes part of a third terminal electrically connected to the common electrode line. Optionally, the fourth via B is disposed in a non-display area (i.e., a peripheral area; see, e.g., the dotted line area in FIG. 2). A printed circuit board may be connected to the third terminal through the fourth via.

In another aspect, the present disclosure provides a method of fabricating a display substrate. In some embodiments, the method includes forming a first electrode on the base substrate; forming a first insulating layer on a side of the first electrode distal to the base substrate; forming a thin film transistor on a side of the first insulating layer distal to the first electrode layer; forming a second insulating layer on a side of the thin film transistor distal to the first insulating layer; forming an organic layer on a side of the second insulating layer distal to the thin film transistor; and forming a second electrode on a side of the organic layer distal to the second insulating layer.

Accordingly, the present disclosure provides a method of fabricating a display substrate having a first electrode and a second electrode on two opposite sides of a thin film transistor, the first electrode and the second electrode being two different electrodes selected from a common electrode and a pixel electrode; and a common electrode line on a same side of the thin film transistor as, and electrically connected to, the common electrode. In some embodiments, the method includes forming a first electrode and a second electrode on two opposite sides of a thin film transistor, the first electrode and the second electrode being two different electrodes selected from a common electrode and a pixel electrode; and forming a common electrode line on a same side of the thin film transistor as the common electrode. Optionally, the method includes forming a first electrode, a first insulating layer, a thin film transistor, a second insulating layer, an organic layer, and a second electrode sequentially on a base substrate along a direction away from the base substrate, the first electrode and the second electrode being two different electrodes selected from a common electrode and a pixel electrode.

In the present method, the first insulating layer and the second insulating layer, as well as the first electrode and the thin film transistor, are formed prior to forming the organic layer. Only the second electrode is formed subsequent to forming the organic layer. The formation of the second electrode is performed by low temperature deposition in combination with wet etching. Thus, the fabrication of the present display substrate obviates the needs for high temperature deposition of any insulating layer or dry etching as required in the conventional display substrate. The issue associated with contamination caused by the decomposition of the organic layer is entirely avoided. Moreover, the present method obviates the need for patterning (e.g., a photoresist process and dry etching) the first insulating layer, which is required in the conventional method to expose lead wire terminals underneath the first insulating layer. The present design greatly simplifies the fabrication process and lowers the manufacture costs.

The first insluting layer may be made of any appropriate material and formed by any appropriate methods, e.g., by chemical vapor deposition (CVD), sputtering, or coating. Optionally, the first insulating layer is formed by plasma enhanced chemical vapor deposition (PECVD). Optionally, the first insulating layer is made of silicon nitride ($SiN_x$), silicon oxide ($SiO_x$), or silicon oxynitride ($SiO_xN_y$). Optionally, the first insulating layer is formed by plasma enhanced chemical vapor deposition (PECVD) using a gas containing $SiH_4$ and $N_2O$.

In some embodiments, the first electrode is a pixel electrode and the second electrode is a common electrode. Accordingly, the step of forming the first electrode includes forming a pixel electrode, and the step of forming the second electrode includes forming a common electrode. Optionally, the method further includes forming a common electrode line subsequent to forming the organic layer and prior to forming the common electrode; the common electrode line is formed between the organic layer and the common electrode. Optionally, the method further includes forming a common electrode line subsequent to forming the common electrode; the common electrode line is formed on a side of the common electrode distal to the organic layer.

In some embodiments, the first electrode is a common electrode and the second electrode is a pixel electrode. Accordingly, the step of forming the first electrode includes forming a common electrode, and the step of forming the second electrode includes forming a pixel electrode. Optionally, the method further includes forming a common electrode line prior to forming the common electrode; the common electrode line is formed between the common electrode and the base substrate. Optionally, the method further includes forming a common electrode line subsequent to forming the common electrode and prior to forming the first insulating layer; a common electrode line is formed between the common electrode and the first insulating layer.

In some embodiments, the first electrode is a common electrode, and the second electrode is a pixel electrode. Optionally, the display substrate further includes a via extending through the second insulating layer and the organic layer, the pixel electrode connected to the drain electrode of the thin film transistor through the via. In this design, the cumulative capacitance between the pixel electrode and the data lines as well as power consumption of the display substrate are smaller as compared to those of a display substrate having a pixel electrode as the first electrode and a common electrode as the second electrode.

Optionally, the thin film transistor is a top-gate thin film transistor. Optionally, the thin film transistor is a bottom-gate thin film transistor.

In some embodiments, the thin film transistor is a bottom-gate thin film transistor. Optionally, the step of forming the thin film transistor includes forming a gate electrode on a side of the first insulating layer distal to the common electrode, forming a gate insulating layer on a side of the gate electrode distal to the first insulating layer, forming an active layer on a side of the gate insulating layer distal to the gate electrode, and forming a source electrode and a drain electrode on a side of the active layer distal to the gate insulating layer. Optionally, the method further includes forming a first via extending through the second insulating layer and the organic layer; the pixel electrode electrically connected to the drain electrode through the first via. Optionally, the method further includes forming a second via extending through the second insulating layer and the organic layer; the second via exposing part of a first terminal electrically connected to a data line. Optionally, the method further includes forming a third via extending through the organic layer, the second insulating layer and the gate insulating layer; the third via exposing part of a second terminal electrically connected to a gate line. Optionally, the method further includes forming a fourth via extending through the organic layer, the second insulating layer, the gate insulating layer and the first insulating layer, the fourth via exposing part of a third terminal electrically connected to a common electrode line.

Figure 3:
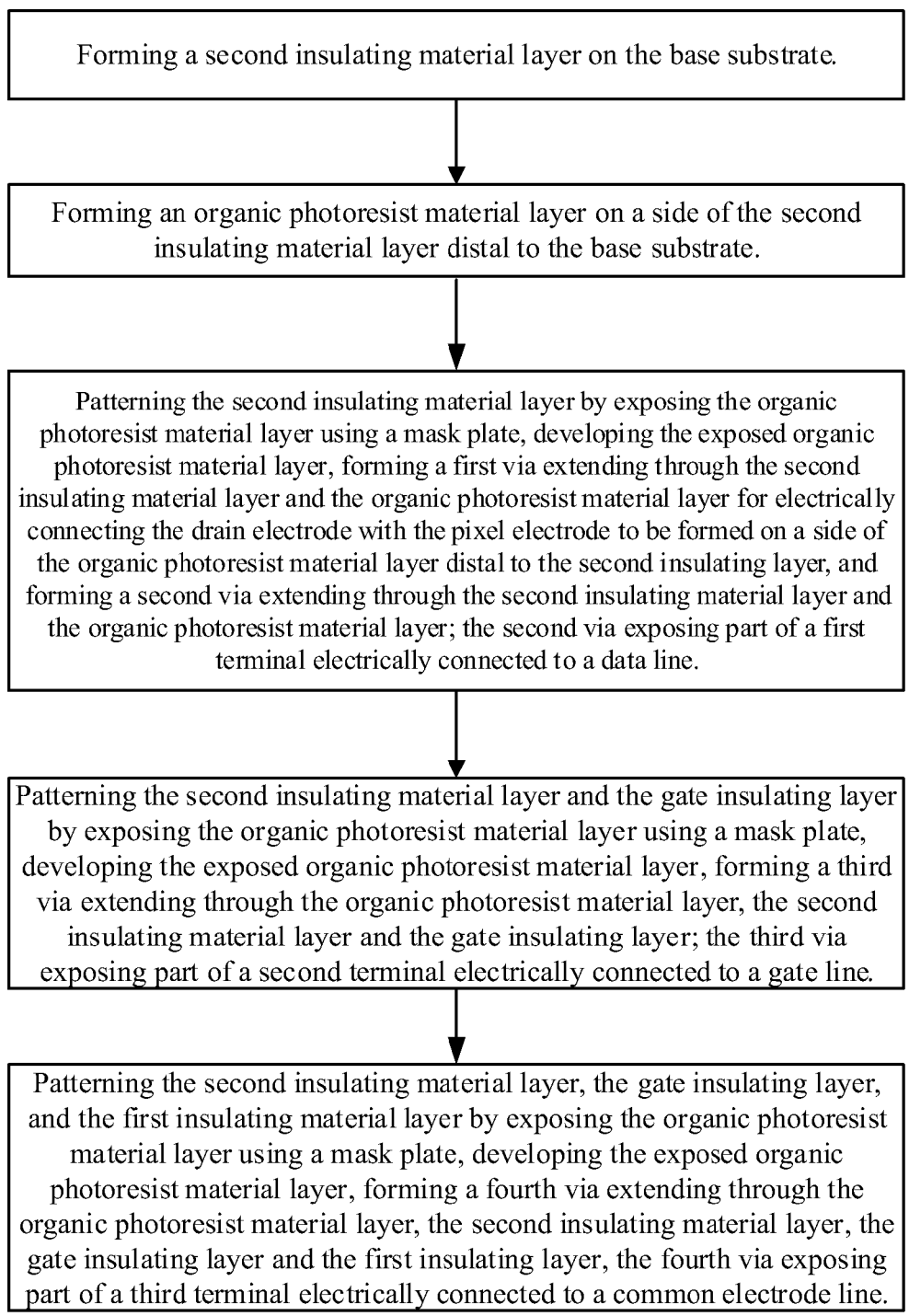
FIG. 3 is a flow chart illustrating a method of fabricating a display substrate in some embodiments.

FIG. 3 is a flow chart illustrating a method of fabricating a display substrate in some embodiments. Referring to FIG. 3, the method in the embodiment includes forming a second insulating material layer on the base substrate; forming an organic photoresist material layer on a side of the second insulating material layer distal to the base substrate; patterning the second insulating material layer by exposing the organic photoresist material layer using a mask plate, developing the exposed organic photoresist material layer, forming a first via extending through the second insulating material layer and the organic photoresist material layer for electrically connecting the drain electrode with the pixel electrode to be formed on a side of the organic photoresist material layer distal to the second insulating layer, and forming a second via extending through the second insulating material layer and the organic photoresist material layer; the second via exposing part of a first terminal electrically connected to a data line; patterning the second insulating material layer and the gate insulating layer by exposing the organic photoresist material layer using a mask plate, developing the exposed organic photoresist material layer, forming a third via extending through the organic photoresist material layer, the second insulating material layer and the gate insulating layer; the third via exposing part of a second terminal electrically connected to a gate line; and patterning the second insulating material layer, the gate insulating layer, and the first insulating material layer by exposing the organic photoresist material layer using a mask plate, developing the exposed organic photoresist material layer, forming a fourth via extending through the organic photoresist material layer, the second insulating material layer, the gate insulating layer and the first insulating layer, the fourth via exposing part of a third terminal electrically connected to a common electrode line. After these patterning steps, the organic photoresist material layer become the organic layer, the first insulating material layer becomes first insulating layer, and the second insulating material layer becomes the second insulating layer. Optionally, all three patterning steps may be performed in a single process, e.g., using a single mask plate.

The second insluting layer may be made of any appropriate material and formed by any appropriate methods, e.g., by chemical vapor deposition (CVD), sputtering, or coating. Optionally, the first insulating layer is formed by plasma enhanced chemical vapor deposition (PECVD). Optionally, the first insulating layer is made of silicon nitride (SiN), silicon oxide ($SiO_x$), or silicon oxynitride ($SiO_xN_y$). Optionally, the first insulating layer is formed by plasma enhanced chemical vapor deposition (PECVD) using a gas containing $SiH_4$ and $N_2O$.

The organic photoresist material layer may be made of any appropriate material and formed by any appropriate methods. Optionally, the organic photoresist material is a resin material, e.g., a resin photoresist material.

In some embodiments, the step of patterning the second insulating material layer to form the first via includes exposing the organic photoresist material layer using a mask plate; developing the exposed organic photoresist material layer to remove organic photoresist material layer in an area corresponding to the drain electrode of the thin film transistor; etching the second insulating material layer in the area corresponding to the drain electrode of the thin film transistor thereby forming the first via extending through the second insulating material layer and the organic photoresist material layer for electrically connecting the drain electrode with the pixel electrode to be formed on a side of the organic photoresist material layer distal to the second insulating layer.

In some embodiments, the data line is electrically connected to a first lead wire through a first terminal. Optionally, the data line, the first lead wire, and the first terminal are in a same layer as the source electrode and the drain electrode. Optionally, the step of forming the first via and the second via can be performed in a same process (e.g., using a same mask plate). A printed circuit board (PCB) may be connected to the first terminal through the second via.

In some embodiments, the gate line is electrically connected to a second lead wire through a second terminal. Optionally, the gate line, the second lead wire, and the second terminal are in a same layer as the gate electrode. Optionally, the step of forming the first via, the second via, and the third via can be performed in a same process (e.g., using a same mask plate). A printed circuit board may be connected to the second terminal through the third via.

In some embodiments, the common electrode line is electrically connected to a third lead wire through a third terminal. Optionally, the common electrode line, the third lead wire, and the third terminal are in a same layer. Optionally, the step of forming the first via, the second via, the third via, and the fourth via can be performed in a same process (e.g., using a same mask plate). A printed circuit board may be connected to the third terminal through the fourth via.

Figure 4A:
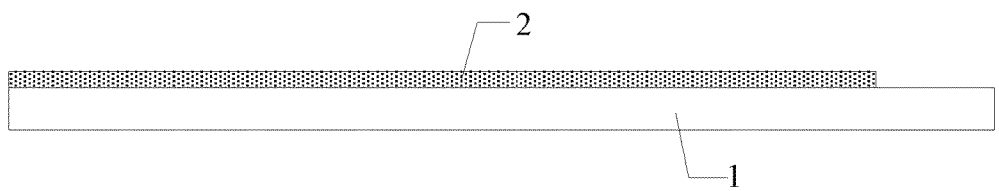
FIG. 4A-4I are schematic views of a process for fabricating the display substrate in some embodiments.

FIG. 4A-4I are schematic view of a process for fabricating the display substrate in some embodiments (e.g., the display substrate in FIG. 2). Referring to FIG. 4A, the process in the embodiment includes forming a common electrode (i.e., a first electrode 2) on the base substrate 1. For example, a conductive material may be deposited on the bases substrate 1, a photoresist material is coated on the base substrate 1 having the conductive material disposed. A mask having a first electrode pattern is placed on the photoresist layer, followed by exposure, development, and wet etching, thereby forming the first electrode 2.

Figure 4B:
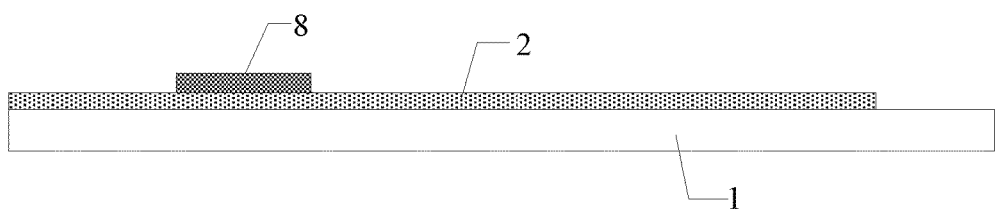

Referring to FIG. 4B, the process in the embodiment also includes forming a common electrode line 8, a third terminal, and a third lead wire connected to the common electrode line 8 through the third terminal on the base substrate 1 having the common electrode formed. For example, a conductive material may be deposited on the bases substrate 1, a photoresist material is coated on the base substrate 1 having the conductive material disposed. A mask having a pattern of the common electrode line 8, the third terminal and the third lead wire is placed on the photoresist layer, followed by UV exposure, development, and wet etching, thereby forming the common electrode line 8, the third terminal and the third lead wire.

Figure 4C:
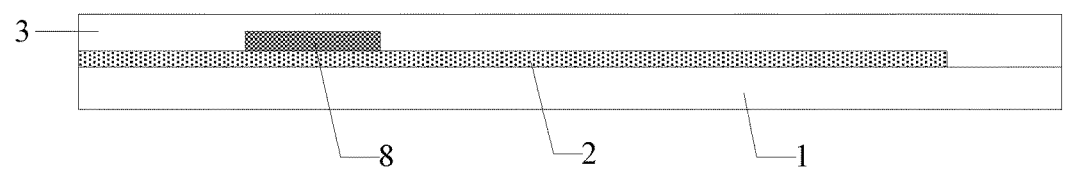

Referring to FIG. 4C, the process in the embodiment also includes forming a first insulating layer 3 on the base substrate 1 having the common electrode line 8, the third terminal and the third lead wire formed. For example, an insulating material selected from the group consisting of silicon nitride ($SiN_x$), silicon oxide ($SiO_x$), or silicon oxynitride ($SiO_xN_y$) may be deposited on the base substrate 1, thereby forming the first insulating layer 3.

Figure 4D:
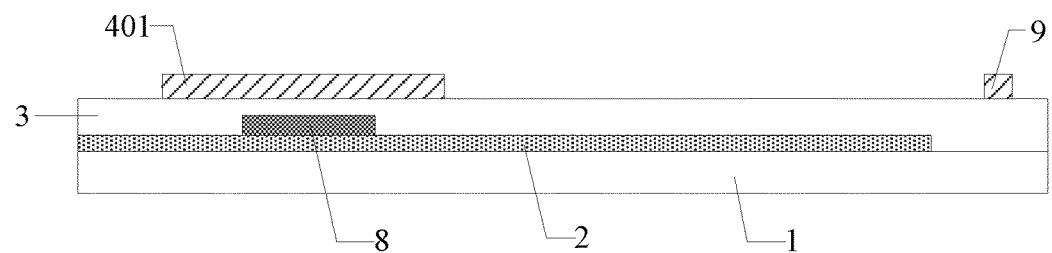

Referring to FIG. 4D, the process in the embodiment also includes forming a gate electrode 401, a gate line, a second terminal 9, and a second lead wire connected to the gate line through the second terminal 9 on the base substrate 1 having the first insulating layer 3 formed. For example, a conductive material may be deposited on the bases substrate 1, a photoresist material is coated on the base substrate 1 having the conductive material disposed. A mask having a pattern of the gate electrode 401, the gate line, the second terminal 9, and the second lead wire is placed on the photoresist layer, followed by UV exposure, development, and wet etching, thereby forming the gate electrode 401, the gate line, the second terminal 9, and the second lead wire.

Figure 4E:
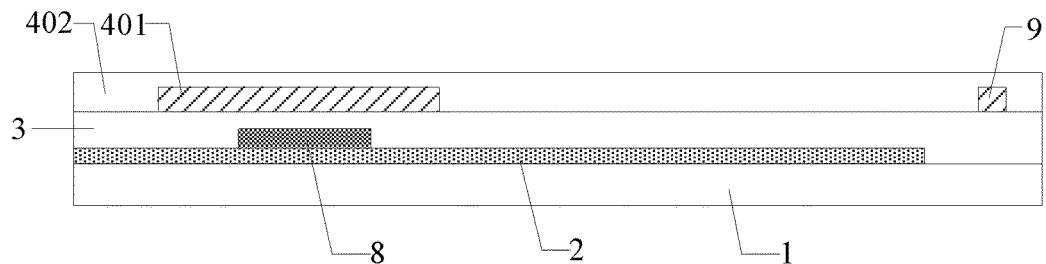

Referring to FIG. 4E, the process in the embodiment also includes forming a gate insulating layer 402 on the base substrate 1 having the gate electrode 401, the gate line, the second terminal 9, and the second lead wire formed. For example, an insulating material selected from the group consisting of silicon nitride ($SiN_x$), silicon oxide ($SiO_x$), or silicon oxynitride ($SiO_xN_y$) may be deposited on the base substrate 1, thereby forming the gate insulating layer 402.

Figure 4F:
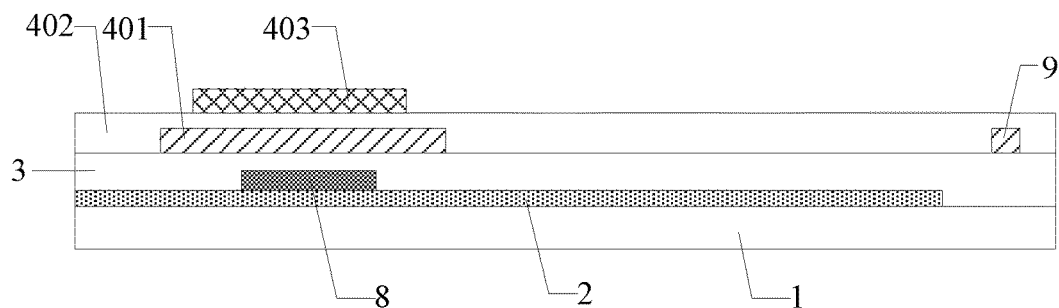

Referring to FIG. 4F, the process in the embodiment also includes forming an active layer 403 on the base substrate 1 having the gate insulating layer 402 formed. For example, a semi-conductive material (e.g., polycrystalline silicon, metal oxides) may be deposited on the bases substrate 1, a photoresist material is coated on the base substrate 1 having the semi-conductive material disposed. A mask having a pattern of the active layer 403 is placed on the photoresist layer, followed by UV exposure, development, and wet etching, thereby forming the active layer 403.

Figure 4G:
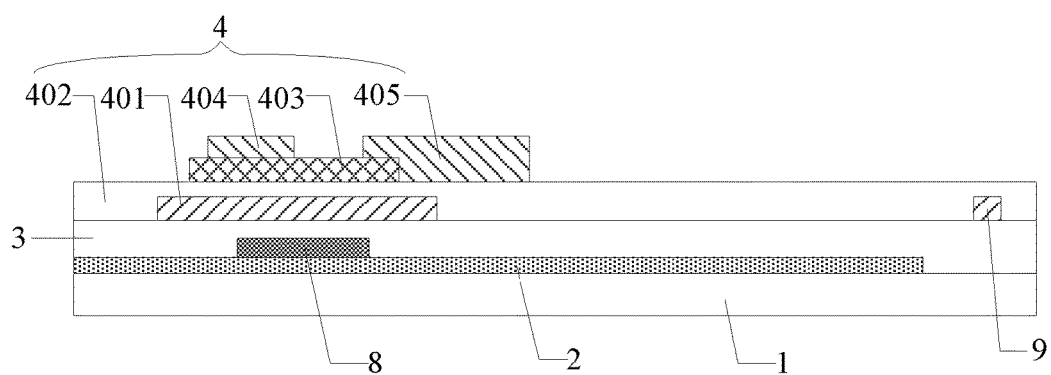

Referring to FIG. 4G, the process in the embodiment also includes forming a source electrode 404, a drain electrode 405, a data line, a first terminal, and a first lead wire connected to the data line through the first terminal on the base substrate 1 having the active layer 403 formed. For example, a conductive material may be deposited on the bases substrate 1, a photoresist material is coated on the base substrate 1 having the conductive material disposed. A mask having a pattern of the source electrode 404, the drain electrode 405, the data line, the first terminal, and the first lead wire is placed on the photoresist layer, followed by UV exposure, development, and wet etching, thereby forming the source electrode 404, the drain electrode 405, the data line, the first terminal, and the first lead wire.

Figure 4H:
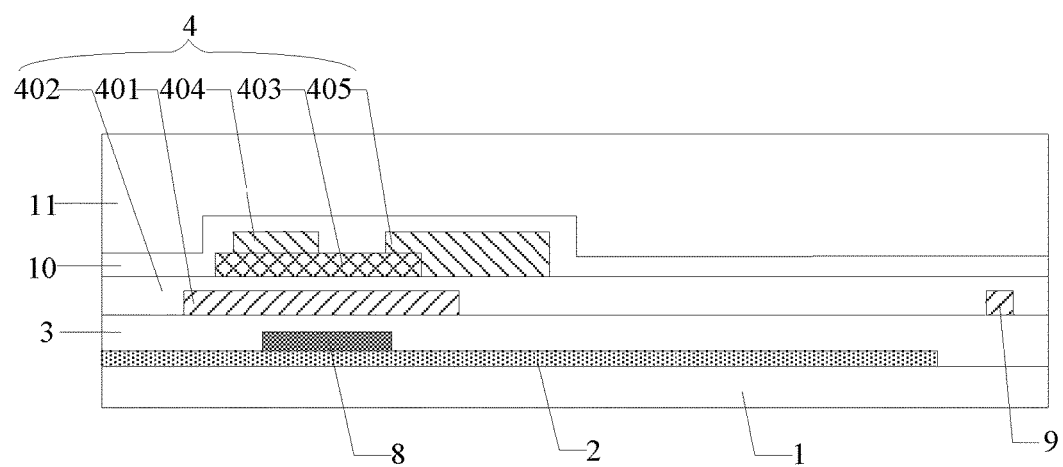

Referring to FIG. 4H, the process in the embodiment further includes forming a second insulating layer 10 and an organic material layer 11 on the base substrate 1 having the source electrode 404, the drain electrode 405, the data line, the first terminal, and the first lead wire formed. For example, an insulating material selected from the group consisting of silicon nitride ($SiN_x$) silicon oxide ($SiO_x$), or silicon oxynitride ($SiO_xN_y$) may be deposited on the base substrate 1, thereby forming the first insulating layer 3. Optionally, the organic material is a resin material, e.g., a resin photoresist material.

Figure 4I:
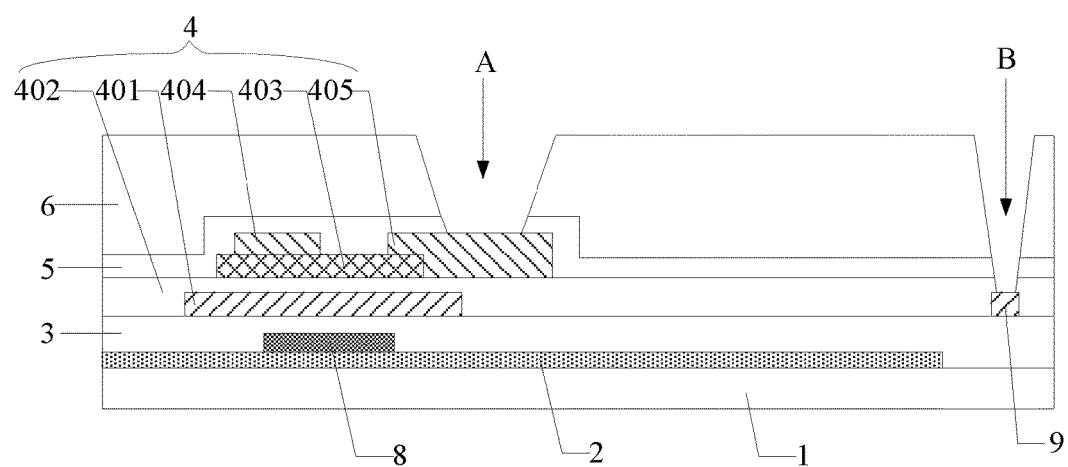

Referring to FIG. 4I, the process in the embodiment further includes forming a first via A, a second via, a third via B, and a fourth via in a single process. The first via A and the second via extend through the organic material layer 11 and the second insulating material layer 10, respectively. The third via B extends through the organic material layer 11, the second insulating material layer 10, and the gate insulating layer 402. The fourth via extends through the organic material layer 11, the second insulating material layer 10, the gate insulating layer 402, and the first insulating layer 3. After this step, the second insulating material layer 10 becomes the second insulating layer 5, and the organic material layer 11 becomes the organic layer 6.

In some embodiments, the process includes exposing the organic material layer 11 (made of a photoresist material) with a mask plate; developing the exposed organic material layer 11 to obtain an organic photoresist material pattern having a first section corresponding to the drain electrode 405, a second section corresponding to the first terminal which is electrically connected to the data line, a third section corresponding to the second terminal 9 which is electrically connected to the gate line, and a fourth section corresponding to the third terminal which is electrically connected to the common electrode line 8; removing the organic photoresist material in these section to expose the second insulating material layer 10; etching the second insulating material layer 10 in the first section thereby forming a first via A extending through the organic material layer 11 and the second insulating material layer 10; etching the second insulating material layer 10 in the second section thereby forming a second via extending through the organic material layer 11 and the second insulating material layer 10; etching the second insulating material layer 10 and the gate insulating layer 402 in the third section thereby forming a third via extending through the organic material layer 11, the second insulating material layer 10, and the gate insulating layer 402; etching the second insulating material layer 10, the gate insulating layer 402, and the first insulating layer 3 in the fourth section thereby forming a fourth via extending through the organic material layer 11, the second insulating material layer 10, the gate insulating layer 402, and the first insulating layer 3.

Referring to FIG. 2, the process in the embodiment further includes forming a second electrode 7 (e.g., a pixel electrode) on the base substrate 1 having the first via A, the second via, the third via B, and the fourth via formed. For example, a conductive material may be deposited on the bases substrate 1, a photoresist material is coated on the base substrate 1 having the conductive material disposed. A mask having a pattern of the pixel electrode is placed on the photoresist layer, followed by UV exposure, development, and wet etching, thereby forming the pixel electrode.

Thus, the present method in some embodiments requires a total of seven patterning steps, i.e., patterning of the common electrode, the common electrode line, the gate electrode, the active layer, the source electrode and the drain electrode, four vias (the first via, the second via, the third via and the fourth via), and the pixel electrode. In contrast, the conventional method requires at least a total of eight patterning steps, i.e., patterning of the gate electrode, the active layer, the source electrode and the drain electrode, the first insulating layer, the pixel electrode, the second insulating layer, the common electrode, and the common electrode line. The present method has the advantages of a simplified fabricating process and lower manufacturing costs.

The present disclosure provides a superior display substrate, a display panel and display apparatus having the same, and a fabricating method thereof. In the present method, the first insulating layer and the second insulating layer, as well as the first electrode and the thin film transistor, are formed prior to forming the organic layer. Only the second electrode is formed subsequent to forming the organic layer. The formation of the second electrode is performed by low temperature deposition in combination with wet etching. Thus, the fabrication of the present display substrate obviates the needs for high temperature deposition of any insulating layer or dry etching as required in the conventional display substrate. The issue associated with contamination caused by the decomposition of the organic layer is entirely avoided. Moreover, the present method obviates the need for patterning (e.g., a photoresist process and dry etching) the first insulating layer, which is required in the conventional method to expose lead wire terminals underneath the first insulating layer. The present design greatly simplifies the fabrication process and lowers the manufacture costs.

In another aspect, the present disclosure provides a liquid crystal display panel. In some embodiments, the liquid crystal display panel includes a display substrate as described herein or fabricated by a method as described herein, a package substrate opposite to the display substrate, and a liquid crystal layer between the display substrate and the package substrate.

In another aspect, the present disclosure provides a display apparatus having a liquid crystal display panel as described herein. Examples of display apparatus include, but are not limited to, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising:
   a base substrate;
   a first electrode on the base substrate;
   a first insulating layer on a side of the first electrode away from the base substrate;
   a thin film transistor on a side of the first insulating layer away from the first electrode, and comprising a source electrode and a drain electrode;
   a second insulating layer on a side of the source electrode and the drain electrode of the thin film transistor away from the first insulating layer, the second insulating layer comprising an inorganic material covering the source electrode and the drain electrode of the thin film transistor;
   an organic layer on a side of the second insulating layer away from the thin film transistor;
   a second electrode on a side of the organic layer away from the second insulating layer; and
   a common electrode line configured to provide a common voltage;
   wherein the first electrode and the second electrode are two different electrodes selected from a common electrode and a pixel electrode;
   the common electrode line is not in contact with the second insulating layer;
   the common electrode line is electrically connected to the common electrode; and
   the organic layer is not in contact with the source electrode and the drain electrode.

2. The display substrate of claim 1, wherein the first electrode is a pixel electrode, and the second electrode is a common electrode; the display substrate further comprising:
   a common electrode line between the organic layer and the common electrode;
   wherein the common electrode line is spaced apart from the second insulating layer by at least the organic layer.

3. The display substrate of claim 1, wherein the first electrode is a pixel electrode, and the second electrode is a common electrode; the display substrate further comprising:
   a common electrode line on a side of the common electrode away from the organic layer;
   wherein the common electrode line is spaced apart from the second insulating layer by at least the organic layer.

4. The display substrate of claim 1, wherein the first electrode is a common electrode, and the second electrode is a pixel electrode; the display substrate further comprising:
   a common electrode line between the common electrode and the base substrate;
   wherein the common electrode line is spaced apart from the second insulating layer by at least the first insulating layer.

5. The display substrate of claim 1, wherein the first electrode is a common electrode, and the second electrode is a pixel electrode; the display substrate further comprising:
   a common electrode line between the common electrode and the first insulating layer;
   wherein the common electrode line is spaced apart from the second insulating layer by at least the first insulating layer.

6. The display substrate of claim 1, wherein the first electrode is a common electrode, and the second electrode is a pixel electrode; the thin film transistor comprises a gate electrode on a side of the first insulating layer away from the common electrode, a gate insulating layer on a side of the gate electrode away from the first insulating layer, an active layer on a side of the gate insulating layer away from the gate electrode, and the source electrode and the drain electrode on a side of the active layer away from the gate insulating layer;
   the display substrate further comprising a first via extending through the second insulating layer and the organic layer; the pixel electrode electrically connected to the drain electrode through the first via.

7. The display substrate of claim 6, further comprising a data line, a first terminal electrically connected to the data line, a second via extending through the second insulating layer and the organic layer, the second via exposing part of the first terminal.

8. The display substrate of claim 6, further comprising a gate line, a second terminal electrically connected to the gate line, a third via extending through the organic layer, the second insulating layer and the gate insulating layer, the third via exposing part of the second terminal.

9. The display substrate of claim 6, further comprising a common electrode line, a third terminal electrically connected to the common electrode, a fourth via extending through the organic layer, the second insulating layer, the gate insulating layer and the first insulating layer, the fourth via exposing part of the third terminal.

10. A liquid crystal display panel, comprising the display substrate of claim 1, a package substrate opposite to the display substrate, and a liquid crystal layer between the display substrate and the package substrate.

11. A display apparatus, comprising the liquid crystal display panel of claim 10.

12. A method of fabricating a display substrate, comprising:
   forming a first electrode on a base substrate;
   forming a first insulating layer on a side of the first electrode away from the base substrate;
   forming a thin film transistor on a side of the first insulating layer away from the first electrode, the thin film transistor formed to comprise a source electrode and a drain electrode;
   forming a second insulating layer on a side of the thin film transistor away from the first insulating layer, the second insulating layer formed to comprise an inorganic material covering the source electrode and the drain electrode of the thin film transistor;
   forming an organic layer on a side of the second insulating layer away from the thin film transistor;
   forming a second electrode on a side of the organic layer away from the second insulating layer; and
   forming a common electrode line configured to provide a common voltage;
   wherein the first electrode and the second electrode are two different electrodes selected from a common electrode and a pixel electrode;

the common electrode line is not in contact with the second insulating layer;

the common electrode line is formed to be electrically connected to the common electrode; and the organic layer is not in contact with the source electrode and the drain electrode.

13. The method of claim 12, wherein the first electrode is a pixel electrode, and the second electrode is a common electrode; the method further comprising:

forming a common electrode line subsequent to forming the organic layer and prior to forming the common electrode; the common electrode line is formed between the organic layer and the common electrode;

wherein the common electrode line is formed to be spaced apart from the second insulating layer by at least the organic layer.

14. The method of claim 12, wherein the first electrode is a pixel electrode, and the second electrode is a common electrode; the method further comprising:

forming a common electrode line subsequent to forming the common electrode; the common electrode line is formed on a side of the common electrode away from the organic layer;

wherein the common electrode line is formed to be spaced apart from the second insulating layer by at least the organic layer.

15. The method of claim 12, wherein the first electrode is a common electrode, and the second electrode is a pixel electrode; the display substrate further comprising:

forming a common electrode line prior to forming the common electrode; the common electrode line is formed between the common electrode and the base substrate;

wherein the common electrode line is formed to be spaced apart from the second insulating layer by at least the first insulating layer.

16. The method of claim 12, wherein the first electrode is a common electrode, and the second electrode is a pixel electrode; the display substrate further comprising:

forming a common electrode line subsequent to forming the common electrode and prior to forming the first insulating layer; a common electrode line is formed between the common electrode and the first insulating layer;

wherein the common electrode line is formed to be spaced apart from the second insulating layer by at least the first insulating layer.

17. The method of claim 12, wherein the first electrode is a common electrode, and the second electrode is a pixel electrode; the step of forming the thin film transistor comprises forming a gate electrode on a side of the first insulating layer away from the common electrode, forming a gate insulating layer on a side of the gate electrode away from the first insulating layer, forming an active layer on a side of the gate insulating layer away from the gate electrode, and forming a source electrode and a drain electrode on a side of the active layer away from the gate insulating layer;

the method further comprising forming a first via extending through the second insulating layer and the organic layer; the pixel electrode electrically connected to the drain electrode through the first via.

18. The method of claim 17, further comprising forming a data line, forming a first terminal electrically connected to the data line, and forming a second via extending through the second insulating layer and the organic layer; the second via exposing part of the first terminal.

19. The method of claim 17, further comprising forming a gate line, forming a second terminal electrically connected to the gate line, and forming a third via extending through the organic layer, the second insulating layer and the gate insulating layer; the third via exposing part of the second terminal.

20. The method of claim 17, further comprising forming a common electrode line, forming a third terminal electrically connected to the common electrode, and forming a fourth via extending through the organic layer, the second insulating layer, the gate insulating layer and the first insulating layer, the fourth via exposing part of the third terminal.

* * * * *